(12) United States Patent
Xu

(10) Patent No.: US 11,239,450 B2
(45) Date of Patent: Feb. 1, 2022

(54) DISPLAY PANEL, METHOD FOR MANUFACTURING THE SAME AND METHOD FOR CONTROLLING THE SAME

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventor: Yuanjie Xu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 607 days.

(21) Appl. No.: 16/099,422

(22) PCT Filed: Apr. 8, 2018

(86) PCT No.: PCT/CN2018/082187
§ 371 (c)(1),
(2) Date: Nov. 6, 2018

(87) PCT Pub. No.: WO2018/233347
PCT Pub. Date: Dec. 27, 2018

(65) Prior Publication Data
US 2021/0226177 A1 Jul. 22, 2021

(30) Foreign Application Priority Data
Jun. 21, 2017 (CN) .......................... 201710475919.X

(51) Int. Cl.
*H01L 51/56* (2006.01)

(52) U.S. Cl.
CPC .................................. *H01L 51/56* (2013.01)

(58) Field of Classification Search
CPC ......... H01L 2251/5338; H01L 27/3276; H01L 51/0097; H01L 51/56; H01L 2227/326;
(Continued)

(56) References Cited

U.S. PATENT DOCUMENTS 9,933,870 B2 *   4/2018   You ........................ G06F 3/041
10,186,447 B2 *  1/2019   Ekkels ................ H01L 21/6835
(Continued)

FOREIGN PATENT DOCUMENTS

| CN | 103824807 A | 5/2014 |
| CN | 104300089 A | 1/2015 |

(Continued)

OTHER PUBLICATIONS

PCT International Search Report, Application No. PCT/CN2018/082187, dated Jul. 2, 2018, 5 pages: with English translation.
(Continued)

*Primary Examiner* — Jaehwan Oh
(74) *Attorney, Agent, or Firm* — Armstrong Teasdale LLP

(57) ABSTRACT

Embodiments of the present disclosure relate to a method for manufacturing a display panel. The method includes providing a hardness-variable material layer and a flexible layer on the hardness-variable material layer, and bonding a chip to the flexible layer. The hardness-variable material layer is set to be in a hard state before bonding the chip to the flexible layer. After bonding the chip to the flexible layer, the hardness-variable material layer is peeled off. The hardness-variable material layer is set to be in a flexible state before peeling off the hardness-variable material layer.

15 Claims, 5 Drawing Sheets

(58) Field of Classification Search
CPC ........ H05K 1/028; H05K 1/147; H05K 1/189; H05K 3/10; H05K 3/32
See application file for complete search history.

(56) References Cited

U.S. PATENT DOCUMENTS

| | | | | |
|---|---|---|---|---|
| 10,873,042 | B2* | 12/2020 | Zhang | H01L 51/0097 |
| 10,996,779 | B2* | 5/2021 | Luo | G02F 1/13338 |
| 2013/0148312 | A1* | 6/2013 | Han | H05K 1/028 |
| | | | | 361/736 |
| 2013/0293816 | A1* | 11/2013 | Jung | H01L 51/52 |
| | | | | 349/139 |
| 2014/0141547 | A1* | 5/2014 | Kim | H01L 51/56 |
| | | | | 438/26 |
| 2014/0307396 | A1* | 10/2014 | Lee | G02F 1/13452 |
| | | | | 361/749 |
| 2015/0021570 | A1* | 1/2015 | Kim | H01L 51/5293 |
| | | | | 257/40 |
| 2015/0036300 | A1* | 2/2015 | Park | H05K 1/14 |
| | | | | 361/749 |
| 2015/0171115 | A1* | 6/2015 | Yamazaki | H01L 21/76816 |
| | | | | 257/43 |
| 2017/0215288 | A1* | 7/2017 | Shi | H01L 27/3276 |
| 2021/0096415 | A1* | 4/2021 | Zhou | G02F 1/133305 |

FOREIGN PATENT DOCUMENTS

| | | |
|---|---|---|
| CN | 204884440 U | 12/2015 |
| CN | 107123617 A | 9/2017 |
| WO | 2015132410 A1 | 9/2015 |

OTHER PUBLICATIONS

PCT Written Opinion, Application No. PCT/CN2018/082187, dated Jul. 2, 2018, 5 pages : with English translation of relevant part.
China First Office Action, Application No. 201710475919.X, dated Feb. 26, 2019, 14 pps.: with English translation.
Cheng et al., "Thermally Tunable, Self-Healing Composites for Soft Robotic Applications", Macromolecular Journals, Macromolecular Materials and Engineering, 2014, DOI:10:1002/mame.201400017, 6 pages.

* cited by examiner

DISPLAY PANEL, METHOD FOR MANUFACTURING THE SAME AND METHOD FOR CONTROLLING THE SAME

CROSS REFERENCE TO RELATED APPLICATIONS

This patent application is a National Stage Entry of PCT/CN2018/082187 filed on Apr. 8, 2018, which claims the benefit and priority of Chinese Patent Application No. 201710475919.X filed on Jun. 21, 2017, the disclosures of which are incorporated herein by reference in their entirety as part of the present application.

BACKGROUND

Embodiments of the present disclosure relate to the field of display technologies, and in particular, to a display panel, a method for manufacturing the same and a method for controlling the same.

When manufacturing a display panel, generally, an integrated circuit (IC) chip is bonded to a base of a display panel by using an anisotropic conductive film (ACF). However, IC chip bonding on a base of a flexible display panel (e.g., a flexible AMOLED) by using the ACF technology is quite different from that performed on a hard base.

BRIEF DESCRIPTION

Embodiments of the present disclosure provide a display panel, a method for manufacturing the same and a method for controlling the same.

A first aspect of the present disclosure provides a method for manufacturing a display panel. The method includes providing a hardness-variable material layer and a flexible layer on the hardness-variable material layer, and bonding a chip to the flexible layer.

In an embodiment of the present disclosure, the hardness-variable material layer is set to be in a hard state before bonding the chip to the flexible layer.

In an embodiment of the present disclosure, the hardness-variable material layer is peeled off after bonding the chip to the flexible layer.

In an embodiment of the present disclosure, the hardness-variable material layer is set to be in a flexible state before peeling off the hardness-variable material layer.

In an embodiment of the present disclosure, the hardness-variable material layer is a composite material including a wax and a polyurethane foam.

In an embodiment of the present disclosure, the hardness-variable material layer is changed to be in a flexible state by heating.

In an embodiment of the present disclosure, the heating is performed by a metal wire embedded into the hardness-variable material layer.

In an embodiment of the present disclosure, providing the hardness-variable material layer and the flexible layer on the hardness-variable material layer includes sequentially forming the hardness-variable material layer and the flexible layer on a hard substrate, setting the hardness-variable material layer to be in a flexible state, and peeling off the hard substrate.

In an embodiment of the present disclosure, providing the hardness-variable material layer and the flexible layer on the hardness-variable material layer further includes setting a heat insulation layer between the hardness-variable material layer and the flexible layer.

In an embodiment of the present disclosure, the method further includes bonding a flexible printed circuit board to the flexible layer after bonding the chip to the flexible layer.

In an embodiment of the present disclosure, the flexible layer includes a base layer and a display layer.

In an embodiment of the present disclosure, the base layer includes a polyimide film.

In an embodiment of the present disclosure, the bonding is performed at a temperature greater than 180° C. and a pressure greater than 60 MPa.

A second aspect of the present disclosure provides a display panel. The display panel includes a hardness-variable material layer.

In an embodiment of the present disclosure, the display panel further includes a flexible layer on the hardness-variable material layer, and a chip on the flexible layer.

In an embodiment of the present disclosure, the hardness-variable material layer is a composite material including a wax and a polyurethane foam.

In an embodiment of the present disclosure, the hardness-variable material layer further includes a metal wire embedded into the hardness-variable material layer.

A third aspect of the present disclosure provides a method for controlling the display panel described in the second aspect of the present disclosure. The controlling method includes setting a hardness-variable material layer to be in a hard state so as to set the display panel as a hard display panel, or setting the hardness-variable material layer to be in a flexible state so as to set the display panel as a flexible display panel.

Further aspects and regions of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1:
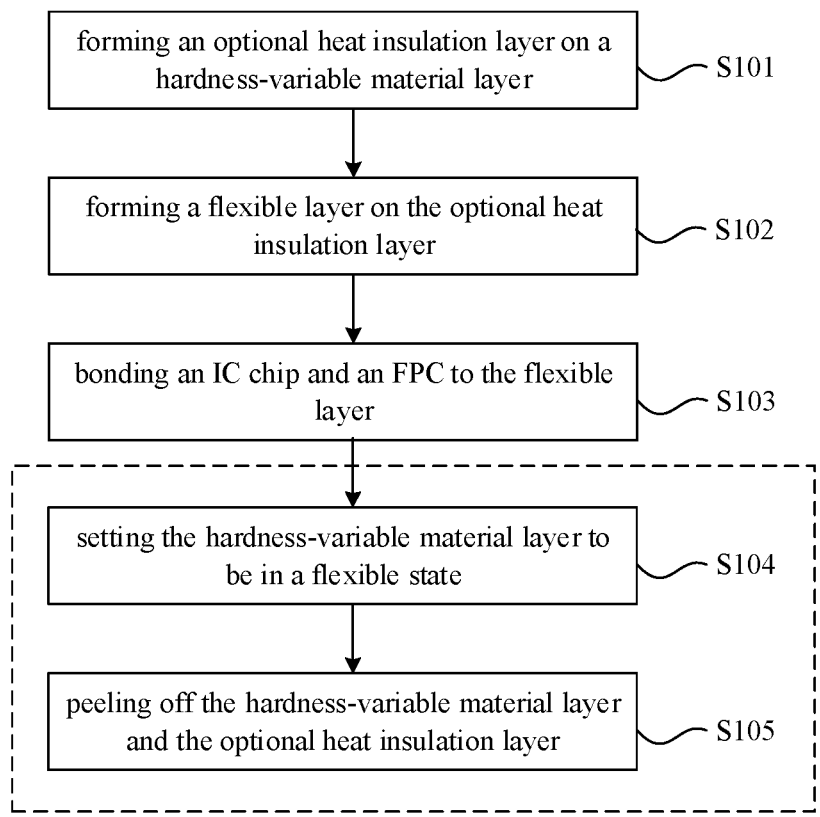
FIG. 1 is a flowchart of a method for manufacturing a display panel in accordance with an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

In addition, it should be noted that, in the description of the present disclosure, the orientations or positions relationship indicated by the terms "upper", "above", "lower", "under", "top", "bottom", "between", etc. are the orientations or positions relationship based on the orientations or positions relationship shown in the drawings, which is merely for the convenience of describing the present disclosure and the simplifying the description, and does not indicate or imply that the referred device or element has to have a specific orientation and is constructed and operated in a specific orientation, therefore, it can't be understood as a limitation to the disclosure. In addition, when an element or a layer is referred to as being "on" another element or layer, the element or the layer can be directly on the another element or layer, or an intermediate element or layer can be present; likewise, when an element or a layer is referred to as being "under" another element or layer, the element or the layer can be directly under another element or layer, or at least one intermediate element or layer can be present, when an element or a layer is referred to as being between two elements or two layers, the element or the layer can be an unique element or layer between the two elements or the two layers, or more than one intermediate element or layer can be present.

The flow diagrams depicted herein are just one example. There may be many variations to this diagram or the steps described therein without departing from the spirit of the disclosure. For instance, the steps may be performed in a differing order or steps may be added, deleted, or modified. All of these variations are considered a part of the claimed disclosure.

Example embodiments will now be described more fully with reference to the accompanying drawings.

Currently, a method for bonding an IC chip on a flexible layer includes forming a flexible layer on a hard base such as a glass base, peeling off the flexible layer from the hard base, and bonding an IC chip and a flexible printed circuit board (FPC) to the flexible layer. However, due to a difference in hardness between the IC chip and the flexible layer, when the IC chip is bonded to the flexible layer by a hot pressing process, the IC chip may sink into the flexible layer, causing the flexible layer to sink and warp and in turn causing the pad, formed at the position corresponding to the sinking and warping position of the flexible layer, to be broken, thereby affecting the electrical connection between the IC chip and the pad. Further, in the case where the IC chip and the FPC are sequentially bonded to the flexible layer, the sinking and warping of the flexible layer due to the bonding of the IC chip may adversely affect the bonding of the FPC.

In an embodiment of the present disclosure, there is provided a method for manufacturing a display panel in which a hardness-variable material layer is employed as a substrate forming respective functional layer. Since the hardness-variable material layer can be switched between a hard state and a flexible state, when manufacturing the flexible display panel, the method in accordance with an embodiment of the present disclosure can prevent warping and sinking of the flexible layer caused when bonding the IC chip.

Figure 2:
FIG. 2 is a schematic view of forming an optional heat insulation layer of a method for manufacturing a display panel in accordance with an embodiment of the present disclosure.

FIG. 1 is a flowchart of a method for manufacturing a display panel in accordance with an embodiment of the present disclosure. As shown in FIG. 1, in the case where the hardness of the hardness-variable material layer is changed by heat, an embodiment of the present disclosure may provide an optional step S101 in which an optional heat insulation layer is formed on the hardness-variable material layer. FIG. 2 further shows a schematic view of forming an optional heat insulation layer 2. The optional heat insulation layer 2 cannot only prevent heat generated when the hardness-variable material layer is heated from being transferred to the subsequently formed flexible layer (which will be described later), but also prevent heat generated when the IC chip is bonded to the flexible layer from being transferred to the hardness-variable material layer such that it may not adversely affect the hardness of the hardness-variable material layer. In accordance with one embodiment of the present disclosure, the optional heat insulation layer 2 may be flexible. It should be understood that, in accordance with embodiments of the present disclosure, this optional heat insulation layer 2 is not necessary, and the optional heat insulation layer 2 may be omitted.

Figure 3:
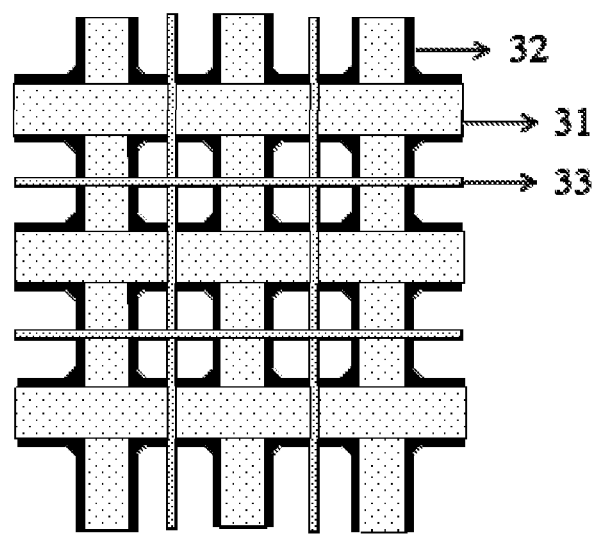
FIG. 3 is a structural schematic view of a hardness-variable material layer in a display panel in accordance with an embodiment of the present disclosure.

FIG. 3 is a structural schematic view of an exemplary hardness-variable material layer 1 in accordance with an embodiment of the present disclosure. As shown in FIG. 3, the hardness-variable material layer 1 has a lattice structure including a composite material containing a polyurethane foam 31 forming a grid and a wax 32 covering the polyurethane foam 31 of the grid. Further, the hardness-variable material layer 1 further includes a metal wire 33 embedded therein. In accordance with an embodiment of the present disclosure, the metal wire 33 may also be formed as a grid structure and nested with the grid structure of the hardness-variable material layer. In accordance with an embodiment of the present disclosure, the metal wire 33 may be copper or aluminum. Illustratively, the hardness-variable material layer may be formed by immersing a common polyurethane foam into a molten wax to form a mixture, forming the above mixture into a grid structure by a 3D printing technique, and forming a copper wire on the grid structure.

Specifically, the hardness-variable material layer 1 can be changed from a hard state to a flexible state by heating the metal wire 33, and the hardness-variable material layer 1 can be changed from the flexible state to the hard state by cooling. It should be understood that the present disclosure is not limited to the specific composition of the hardness-variable material and the mechanism for changing the hardness, and any suitable hardness-variable material can be used in the present disclosure.

Figure 4:
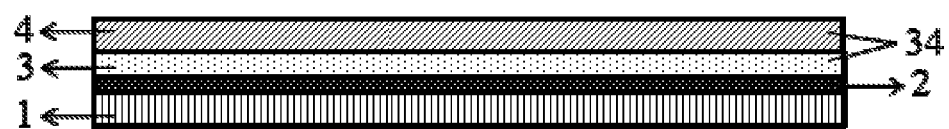
FIG. 4 is a schematic view of forming a flexible layer of a method for manufacturing a display panel in accordance with an embodiment of the present disclosure.

As shown in FIG. 1, in step S102, a flexible layer is formed on the hardness-variable material layer or on an optional heat insulation layer (when present). FIG. 4 further shows a schematic view of forming a flexible layer 34.

As shown in FIG. 4, a flexible layer 34 is formed on the optional heat insulation layer 2. In an embodiment of the present disclosure, the flexible layer 34 may include a base layer 3 and a display layer 4. As an example, the base layer 3 may include a polyimide film. The display layer 4 may be an OLED display layer or an LCD display layer, which is not limited by the embodiments of the present disclosure.

Figure 5:
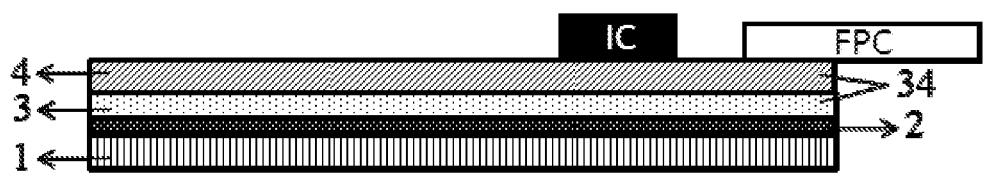
FIG. 5 is a schematic view of bonding a chip and a flexible printed circuit board of a method for manufacturing a display panel in accordance with an embodiment of the present disclosure.

As shown in FIG. 1, in step S103, an IC chip and an FPC are bonded to the flexible layer. FIG. 5 further shows a schematic view of bonding an IC chip and a FPC.

As shown in FIG. 5, the IC chip and the FPC are bonded to the flexible layer 34, respectively. In an embodiment of the present disclosure, the order of bonding the IC chip and bonding the FPC is not specifically limited.

As an example, an electrical connection can be made between the IC chip and the FPC in accordance with actual functional needs.

In an embodiment of the present disclosure, bonding an IC chip and a FPC are performed by using a hot pressing process. As an example, the process conditions of bonding are: a temperature greater than 180° C. and a pressure greater than 60 MPa.

On one hand, in an embodiment of the present disclosure, the hardness-variable material layer 1 and the optional heat insulation layer 2 may not be peeled off after bonding the IC chip and the FPC. When the hardness-variable material layer 1 is required to be in a hard state in the subsequent processing, the hardness-variable material layer 1 will not be heated to facilitate the detecting, assembling, transporting, and the like of the display panel. When the hardness-variable material layer 1 is required to be in a flexible state, the hardness-variable material layer 1 will be heated to make the hardness-variable material layer 1 being in the flexible state, thereby facilitating bending or winding the display panel. Therefore, since the display panel manufactured by the steps S101 to S103 shown in FIG. 1 includes the hardness-variable material layer, the display panel is a display panel that can be switched between a hard state and a flexible state.

Figure 6:
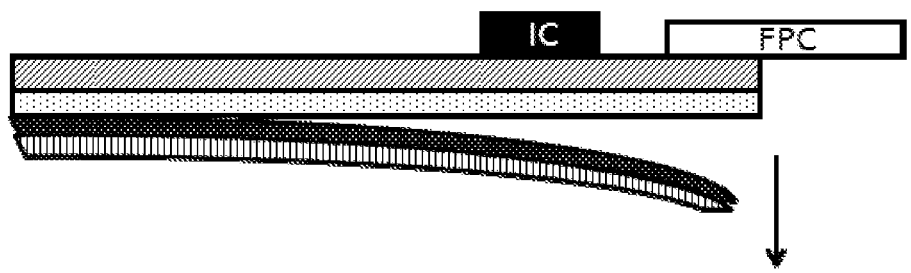
FIG. 6 is a schematic view of peeling off a hardness-variable material layer and an optional heat insulation layer of a method for manufacturing a display panel in accordance with an embodiment of the present disclosure.

On the other hand, in an embodiment of the present disclosure, the hardness-variable material layer 1 and the optional heat insulation layer 2 can also be peeled off after bonding the IC chip and the FPC. As shown in FIG. 1, step S104 and step S105 in the broken line frame are steps of peeling off the hardness-variable material layer 1 and the optional heat insulation layer 2. It should be noted that step S104 and step S105 are optional steps. In step S104, the hardness-variable material layer is set to be in a flexible state. For example, the hardness-variable material layer can be changed from a hard state to a flexible state by heating. In step S105, the hardness-variable material layer and the optional heat insulation layer are peeled off. FIG. 6 further shows a schematic view of peeling off a hardness-variable material layer and an optional heat insulation layer. Since the hardness-variable material layer is in a flexible state, the hardness-variable material layer and the optional heat insulation layer can be easily peeled off, thereby obtaining a display panel which can be only in a flexible state.

Figure 7:
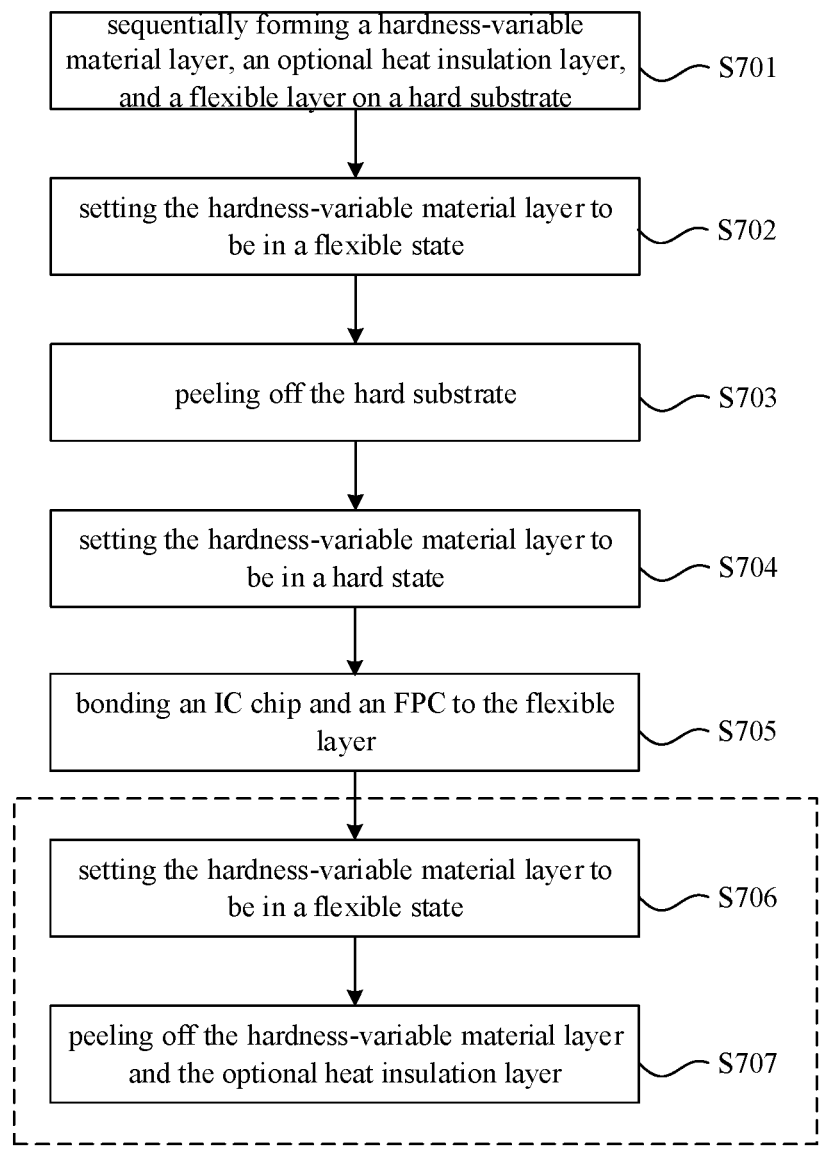
FIG. 7 is a flowchart of a method for manufacturing a display panel in accordance with another embodiment of the present disclosure.
Figure 8:
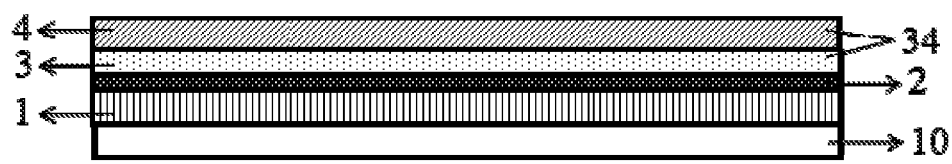
FIG. 8 is a schematic view of forming a hardness-variable material layer, an optional heat insulation layer, and a flexible layer of a method for manufacturing a display panel in accordance with another embodiment of the present disclosure.

FIG. 7 is a flowchart of a method for manufacturing a display panel in accordance with another embodiment of the present disclosure. As shown in FIG. 7, in step S701, a hardness-variable material layer, an optional heat insulation layer, and a flexible layer are sequentially formed on a hard substrate. FIG. 8 further shows a schematic view of sequentially forming the hardness-variable material layer 1, the optional heat insulation layer 2, and the flexible layer 34 on the hard substrate 10.

In an embodiment of the present disclosure, the hard substrate 10 may be a rigid substrate such as glass to support the hardness-variable material layer 1, the optional heat insulation layer 2, and the flexible layer 34 formed thereon, thereby ensuring film forming quality. The description about the hardness-variable material layer 1, the optional heat insulation layer 2, and the flexible layer 34 is as described above, and will not be repeated herein.

As shown in FIG. 7, in step S702, the hardness-variable material layer is set to be in a flexible state. For example, the hardness-variable material layer 1 can be changed into a flexible state by heating the metal wire embedded into the hardness-variable material layer 1.

Figure 9:
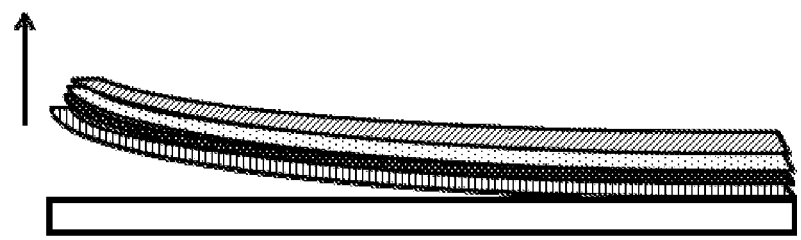
FIG. 9 is a schematic view of peeling off a hard substrate of a method for manufacturing a display panel in accordance with another embodiment of the present disclosure.

As shown in FIG. 7, in step S703, the hard substrate is peeled off. FIG. 9 further shows a schematic view of the peeling off the hard substrate. As shown in FIG. 9, since the hardness-variable material layer is in a flexible state, the hardness-variable material layer, the optional heat insulation layer, and the flexible layer can be easily peeled off from the hard substrate. In other words, the hard substrate is peeled off. This is because, if the hard substrate is peeled off after bonding the IC chip and the FPC, the connection between the IC chip and the FPC and the flexible layer of the display panel will be affected, thereby affecting the displaying effect of the flexible display panel.

As shown in FIG. 7, in step S704, the hardness-variable material layer is set to be in a hard state. As described above, the hardness-variable material layer 1 can be cooled to be changed into a hard state. Bringing the hard variable material layer 1 to be in a hard state enables the effective support provided to the flexible layer 34 when the IC chip and the FPC are bonded to the flexible layer 34, thereby preventing the flexible layer from wrapping and sinking due to bonding the IC chip and the FPC.

As shown in FIG. 7, in step S705, the IC chip and the FPC are bonded to the flexible layer. Step S705 in FIG. 7 is similar to step S103 in FIG. 1, and details will not be repeated herein.

Similar to the above embodiment, after bonding the IC chip and the FPC, the hardness-variable material layer 1 and the optional heat insulation layer 2 cannot be peeled off, thereby obtaining a display panel that can be switched between a hard state and a flexible state. On the other hand, after bonding the IC chip and the FPC, the hardness-variable material layer 1 and the optional heat insulation layer 2 can also be peeled off, thereby obtaining a display panel which can be only in a flexible state. As shown in FIG. 7, step S706 and step S707 in the broken line frame are steps of peeling off the hardness-variable material layer 1 and the optional heat insulation layer 2. It should be noted that step S706 and step S707 are optional steps. Steps S706 and S707 in FIG. 7 are similar to steps S104 and S105 in FIG. 1, which will not repeated herein.

In an embodiment of the present disclosure, there is also provided a display panel. The display panel includes a hardness-variable material layer to enable the display panel to switch between a hard state and a flexible state.

Figure 10:
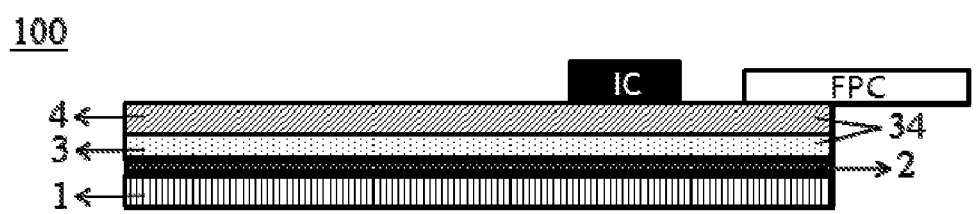
FIG. 10 is a schematic view of a cross section of a display panel in accordance with an embodiment of the present disclosure.

FIG. 10 is a schematic view of a cross section of a display panel 100 in accordance with an embodiment of the present disclosure. As shown in FIG. 10, the display panel 100 includes a hardness-variable material layer 1, an optional heat insulation layer 2 on the hardness-variable material layer 1, a flexible layer 34 on the optional heat insulation layer 2, and an IC chip and a FPC which being bonded to the flexible layer 34.

As described above, the hardness-variable material layer 1 can be switched between a hard state and a flexible state. Specifically, the hardness-variable material layer 1 can be changed from a hard state to a flexible state by heating. Further, the hardness-variable material layer 1 can be changed from a flexible state to a hard state by cooling. The flexible layer 34 may include a base layer 3 and a display layer 4. As an example, the base layer 3 may include a polyimide film. The display layer 4 may be an OLED display layer or an LCD display layer, which will not be specifically limited herein. It should be noted that other descriptions regarding the hardness-variable material layer 1, the optional heat insulation layer 2, the flexible layer 34, and the IC chip and the FPC are similar to the above embodiments, which will not be repeated herein.

In an embodiment of the present disclosure, there is also provided a method for controlling the above display panel. The controlling method includes setting the hardness-variable material layer to be in a hard state so as to set the display panel as a hard display panel, or setting the hardness-variable material layer to be in a flexible state so as to set the display panel as a flexible display panel. For example, the hardness-variable material layer can be changed into a flexible state by heating it.

In an embodiment of the present disclosure, when manufacturing a flexible display panel, by providing a hardness-variable material layer, warping and sinking of a flexible layer caused by bonding the IC chip are avoided when the IC chip is bonded to the flexible layer, thereby ensuring the quality of the product. Further, the method for preparing the hardness-variable material layer is simple, and the hardness-variable material can be reused, thereby saving cost.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. A method for manufacturing a display panel, the method comprising:
providing a hardness-variable material layer and a flexible layer on the hardness-variable material layer; and
bonding a chip to the flexible layer,
wherein the hardness-variable material layer is a composite material comprising a wax and a polyurethane foam.

2. The method according to claim 1, wherein the hardness-variable material layer is set to be in a hard state before bonding the chip to the flexible layer.

3. The method according to claim 1, further comprising peeling off the hardness-variable material layer after bonding the chip to the flexible layer.

4. The method according to claim 3, wherein the hardness-variable material layer is set to be in a flexible state before peeling off the hardness-variable material layer.

5. The method according to claim 1, wherein the hardness-variable material layer is changed to a flexible state by heating.

6. The method according to claim 5, wherein the heating is performed by a metal wire embedded into the hardness-variable material layer.

7. The method according to claim 1, wherein providing the hardness-variable material layer and the flexible layer on the hardness-variable material layer comprises sequentially forming the hardness-variable material layer and the flexible layer on a hard substrate, setting the hardness-variable material layer to be in a flexible state, and peeling off the hard substrate.

8. The method according to claim 1, wherein providing the hardness-variable material layer and the flexible layer on the hardness-variable material layer further comprises setting a heat insulation layer between the hardness-variable material layer and the flexible layer.

9. The method according to claim 1, further comprising bonding a flexible printed circuit board to the flexible layer after bonding the chip to the flexible layer.

10. The method according to claim 1, wherein the flexible layer comprises a base layer and a display layer.

11. The method according to claim 10, wherein the base layer comprises a polyimide film.

12. A display panel comprising:
a hardness-variable material layer;
a flexible layer on the hardness-variable material layer; and
a chip on the flexible layer;
wherein the hardness-variable material layer is a composite material including a wax and a polyurethane foam.

13. The display panel according to claim 12, wherein the hardness-variable material layer further comprises a metal wire embedded into the hardness-variable material layer.

14. The display panel according to claim 12, wherein a heat insulation layer is set between the hardness-variable material layer and the flexible layer.

15. The method according to claim 7, wherein providing the hardness-variable material layer and the flexible layer on the hardness-variable material layer further comprises setting a heat insulation layer between the hardness-variable material layer and the flexible layer.

* * * * *